United States Patent
Lee et al.

(10) Patent No.: US 7,435,678 B2
(45) Date of Patent: Oct. 14, 2008

(54) METHOD OF DEPOSITING NOBLE METAL ELECTRODE USING OXIDATION-REDUCTION REACTION

(75) Inventors: Jung-hyun Lee, Yongin-si (KR); Sang-jun Choi, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 298 days.

(21) Appl. No.: 11/207,722

(22) Filed: Aug. 22, 2005

(65) Prior Publication Data

US 2006/0040486 A1    Feb. 23, 2006

(30) Foreign Application Priority Data

Aug. 20, 2004    (KR)    .................. 10-2004-0065878

(51) Int. Cl.
  *H01L 21/00*    (2006.01)
  *H01L 21/44*    (2006.01)
(52) U.S. Cl. .................. 438/650; 438/644; 438/654; 438/680; 438/681; 438/686; 257/E21.009; 257/E21.021; 257/E21.168; 257/E21.295; 257/E21.584
(58) Field of Classification Search ................. 438/597, 438/650, 644, 686, 680, 654, 681; 257/E21.011, 257/E21.009, E21.008, E21.021, E21.168, 257/E21.295, E21.584
See application file for complete search history.

(56) References Cited

U.S. PATENT DOCUMENTS

| | | | |
|---|---|---|---|
| 6,271,131 B1* | 8/2001 | Uhlenbrock et al. | 438/681 |
| 2001/0019241 A1* | 9/2001 | Srivastava et al. | 313/483 |
| 2002/0192900 A1* | 12/2002 | Athavale et al. | 438/243 |
| 2004/0232467 A1* | 11/2004 | Otsuki et al. | 257/303 |
| 2005/0020060 A1* | 1/2005 | Aaltonen et al. | 438/650 |

* cited by examiner

*Primary Examiner*—Michael S Lebentritt
(74) *Attorney, Agent, or Firm*—Buchanan Ingersoll & Rooney PC

(57) ABSTRACT

Provided is a method of depositing a noble metal layer using an oxidation-reduction reaction. The method includes flowing a noble metal source gas, an oxidizing gas, and a reducing gas into a reaction chamber; and generating plasma in the reaction chamber to form a noble metal layer or a noble metal oxide layer on a bottom structure.

22 Claims, 5 Drawing Sheets

METHOD OF DEPOSITING NOBLE METAL ELECTRODE USING OXIDATION-REDUCTION REACTION

CROSS-REFERENCE TO RELATED APPLICATIONS

This application claims priority under 35 U.S.C. §119 to Korean Patent Application No. 10-2004-0065878, which was filed on Aug. 20, 2004 in the Korean Intellectual Property Office, the disclosure of which is incorporated herein in its entirety by reference.

BACKGROUND

Noble metals such as ruthenium (Ru), iridium (Ir), platinum (Pt) and gold (Au), as well as alloys and oxides thereof, can be used to form electrically conductive layers such as electrodes in semiconductors devices (e.g., capacitors).

FIG. 1A is a cross-sectional view of a conventional semiconductor capacitor C. Referring to FIG. 1A, the semiconductor capacitor C comprises a bottom electrode 21, a dielectric layer 22, and a top electrode 23 sequentially formed on a bottom structure 10.

FIG. 1B is a cross-sectional view of a conventional semiconductor memory device using a transistor as a bottom structure. Referring to FIG. 1B, a first impurity region 12a and a second impurity region 12b are formed in a semiconductor substrate 11, and a gate insulating layer 13 and a gate electrode 14 are formed in a channel region between the first impurity region 12a and the second impurity region 12b. An insulating layer 15 is formed over the first impurity region 12a, the second impurity region 12b and the gate electrode 14. A via is formed through the insulating layer 15 and the via is filled with a conductive material to form a conductive plug 16. The conductive plug may comprise a conductive material such as titanium nitride (TiN). A semiconductor capacitor C, including bottom electrode 21, dielectric layer 22 and top electrode 23, is formed over the conductive plug such that the bottom electrode 21 is in electrical contact with the second impurity region 12b through the conductive plug 16.

One or both of the electrodes in the semiconductor capacitor C may be formed of a single metal, an electrically conductive metal alloy, or an electrically conductive metal oxide. A preferred electrode comprises a noble metal such as Ru, Ir, Pt, or Au. The electrodes 21,23 can be formed using chemical vapor deposition (CVD) or atomic layer deposition (ALD).

During formation of the semiconductor capacitor C, the bottom electrode 21 can be formed on a bottom structure that may comprise an insulating layer (e.g., $SiO_2$), a conductive layer (e.g., TiN), or a semiconducting layer (e.g., Si). The crystal structure of the material(s) forming the bottom structure is typically different than that of a noble metal. As a result, the grain structure of a bottom electrode comprising a noble metal is typically coarse and adhesion of the noble metal to the bottom structure can be poor. A further consequence is that the bottom electrode can have a higher than desired specific resistance.

FIG. 2 is a scanning electron microscope (SEM) image of a ruthenium coating on $SiO_2$. The ruthenium coating was formed using chemical vapor deposition. The ruthenium is irregularly formed and is not uniformly distributed on the $SiO_2$. Further, the adhesion of the ruthenium to the $SiO_2$ is poor.

During formation of a semiconductor capacitor, after the bottom electrode is formed, a dielectric layer is formed on the bottom electrode and both the dielectric layer and bottom electrode can be subjected to high temperature heat-treatment. During the heat-treatment, material comprising the noble metal bottom electrode of FIG. 2 can become further agglomerated, and thus the capacitor device including the bottom electrode cannot be used.

Using an ALD method, a noble metal source gas can be reacted with $O_2$ to form a noble metal layer. However, the reaction with oxygen can result in the incorporation of an excess amount of $O_2$ in the noble metal layer, and accordingly the noble metal electrode can be oxidized. Likewise, a noble metal source gas can be reacted with $H_2$ using the ALD method. However, when only $H_2$ is introduced, the noble metal source gas is not sufficiently decomposed to form the noble metal layer. Accordingly, there is an interest in improved methods of forming noble metal layers suitable for use in semiconductor devices.

SUMMARY

A method of forming a noble metal layer using an oxidation-reduction reaction comprises flowing a noble metal source gas, an oxidizing gas, and a reducing gas into a reaction chamber, and forming plasma in the reaction chamber to form a noble metal-containing layer (e.g., a noble metal layer or a noble metal oxide layer) on a bottom structure. The noble metal-containing layer, which has improved adhesion to the bottom structure, can be used as a conductive electrode.

The noble metal source gas, the oxidizing gas, and the reducing gas may be simultaneously flowed into the reaction chamber. The noble metal source gas may comprise a cyclopentadienyl precursor such as at least one of $Ru(i-Pr-Cp)_2$ and Ru(i-Pr)Cp(ethanol). The oxidizing gas may include at least one of $O_2$ and $NO_2$ and the reducing gas may include at least one of $NH_3$, $H_2O$ and $H_2$. An operation temperature in the reaction chamber may be about 150-350° C.

BRIEF DESCRIPTION OF THE DRAWINGS

The above and other features and advantages will become more apparent by describing in detail exemplary embodiments thereof with reference to the attached drawings in which.

DETAILED DESCRIPTION OF PREFERRED EMBODIMENTS

Figure 1A:
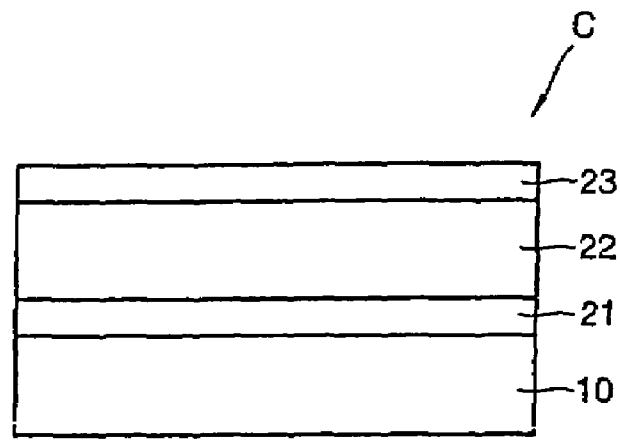
FIGS. 1A and 1B are cross-sectional views of a conventional semiconductor capacitor and a memory device using the same, respectively.
Figure 1B:
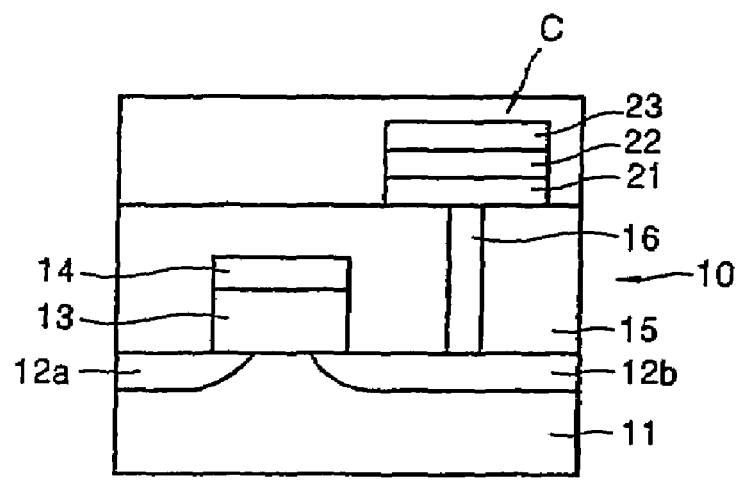
Figure 2:
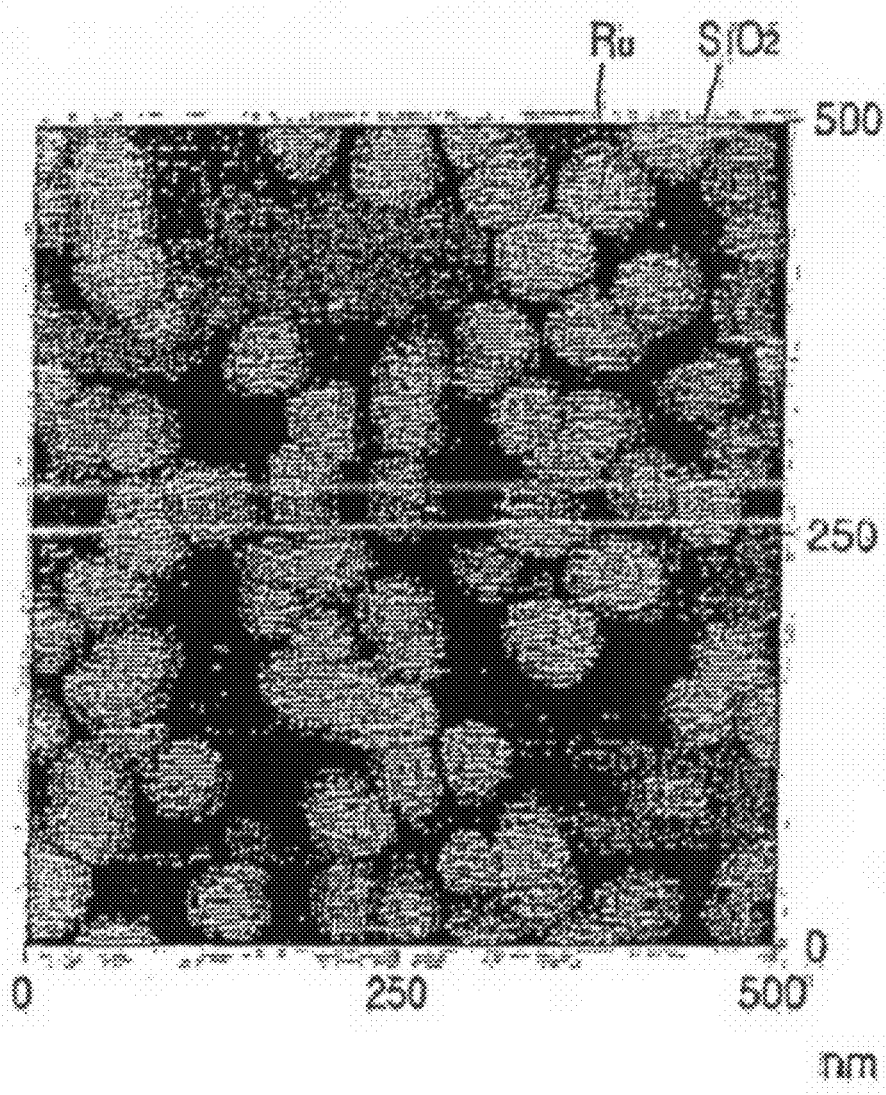
FIG. 2 is a scanning electron microscope (SEM) image of a ruthenium coating on $SiO_2$. The ruthenium coating was formed using chemical vapor deposition.

Hereinafter, a method of depositing a noble metal layer using an oxidation-reduction reaction will be described in more detail with reference to the attached drawings. In the drawings, the sizes and thicknesses of layers and zones are exaggerated for clarity.

Figure 3A:
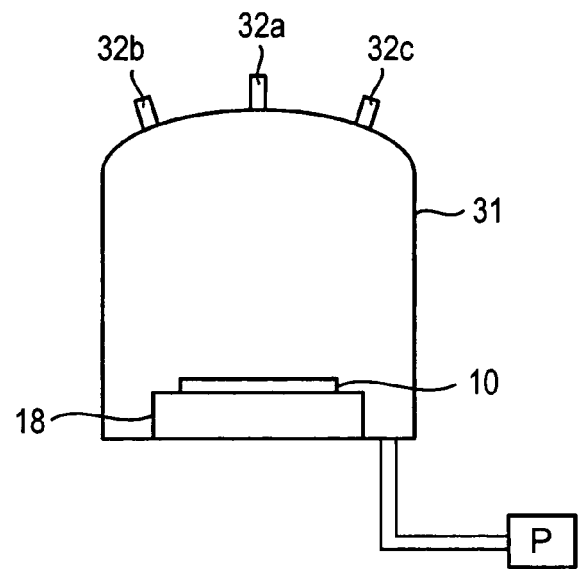
FIG. 3A is a schematic view of an atomic layer deposition (ALD) apparatus for depositing noble metal layers using an oxidation-reduction reaction.

FIG. 3A is a schematic view of an atomic layer deposition (ALD) apparatus for depositing noble metal layers. According to a preferred embodiment, a noble metal layer is deposited using an ALD method. Referring to FIG. 3A, a bottom structure 10, which can be comprise a semiconductor material such as Si, a dielectric material such as $SiO_2$, or an electrically conductive material such as TiN, is placed in a reaction chamber 31 and a vacuum pump P is used to create a vacuum within the reaction chamber. The bottom structure 10 is supported by a base 18. During operation, the temperature within the reaction chamber can be about 150-350° C. Typically, an initial vacuum within the reaction chamber is $10^{-8}$-$10^{-7}$ Torr. A source gas, reaction gases, and a purge gas can be flowed into the reaction chamber 31 through gas supply tubes 32a, 32b, and 32c.

Figure 3B:
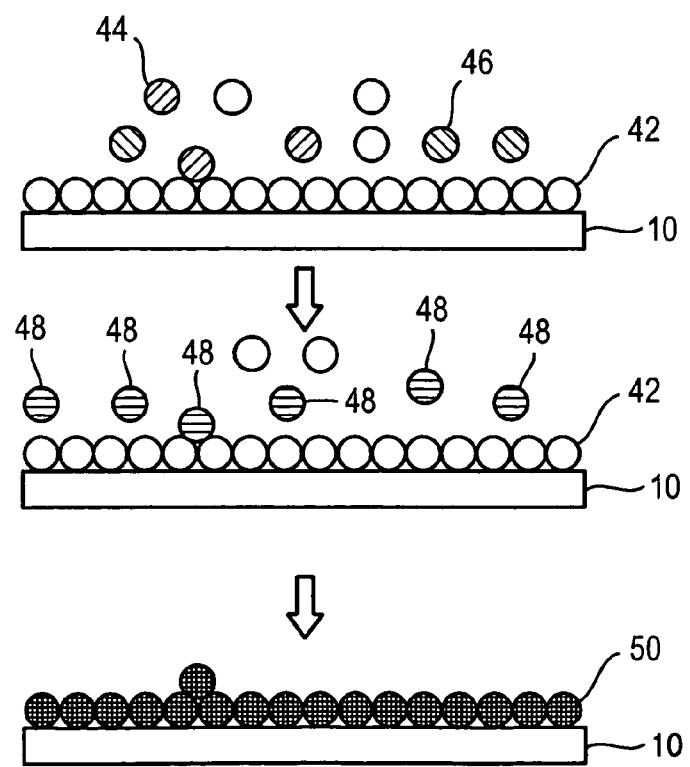
FIGS. 3B and 3C are views illustrating a method of depositing noble metal layers using an oxidation-reduction reaction.
Figure 3C:
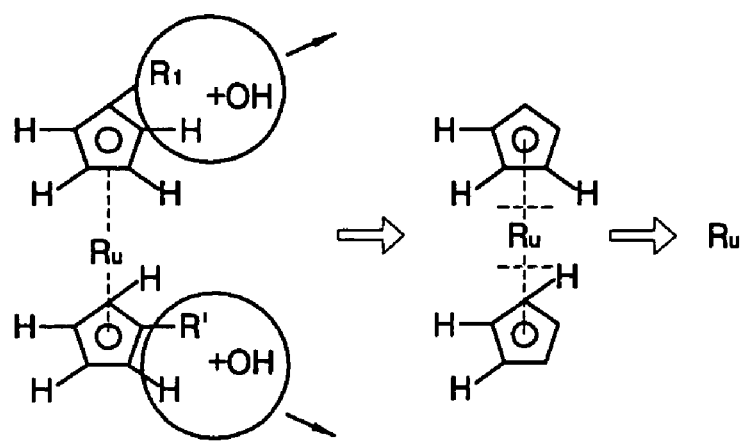

FIGS. 3B and 3C are views illustrating a method of depositing a noble metal layer using an oxidation-reduction reaction. Referring to FIG. 3B, a noble metal precursor 42, i.e., a source gas comprising a material adapted to form a noble metal layer is flowed into the reaction chamber 31. The noble metal source gas may comprise a cyclopentadienyl ($C_5H_5$) ligand or a substituted cyclopentadienyl ligand. The cyclopentadienyl ligand (hereinafter abbreviated Cp) is π-bonded to a noble metal. Exemplary precursors that can be used to form ruthenium layers include Ru(i-Pr-Cp)$_2$ and Ru(i-Pr)Cp(ethanol), where i-Pr stands for an isopropyl group. As illustrated in FIG. 3B, the noble metal precursor 42 can form a coating on the bottom structure 10.

A vacuum pump P, optionally in conjunction with a purge gas such as argon (Ar), neon (Ne) or nitrogen ($N_2$), can be used to reduce the concentration of gases within the chamber before or after flowing the noble metal source gas into the reaction chamber. For example, a vacuum can be formed within the reaction chamber after formation of a noble metal precursor coating on the bottom structure.

To form the noble metal layer, an oxidizing gas 44 and a reducing gas 46 are flowed into the reaction chamber 31 through the gas supply tubes 32a, 32b, and 32c. According to one preferred embodiment, the oxidizing gas and the reducing gas are simultaneously flowed into the reaction chamber. According to a further preferred embodiment, the oxidizing gas, the reducing gas and the noble metal source gas are simultaneously flowed into the reaction chamber. The oxidizing gas may comprise $O_2$ and/or $NO_2$ and the reducing gas may comprise $NH_3$, $H_2O$ and/or $H_2$.

The ratio of the oxidizing gas to the reducing gas can be used to control the properties of the noble metal layer. The ratio of the reducing gas to the oxidizing gas can be selected to form a noble metal layer or a noble metal oxide layer. For example, to form a noble metal layer, preferably the ratio of the reducing gas to the oxidizing gas is greater than about 90 atomic % based on a total of the reducing gas and oxidizing gas flowed into the reaction chamber. To form a noble metal oxide layer, preferably the ratio of the reducing gas to the oxidizing gas is less than about 10 atomic % based on a total of the reducing gas and oxidizing gas flowed into the reaction chamber.

A plasma is formed within the chamber to accelerate the reaction of the oxidizing gas with the reducing gas to form $OH^-$ radicals 48. The $OH^-$ radicals 48 can react with the noble metal precursor 42 to form a noble metal layer 50 on the bottom structure 10.

Referring to FIG. 3C, the formation of a noble metal layer comprising ruthenium will now be explained in more detail. When the reaction gases, i.e., the oxidizing gas and the reducing gas are flowed into the reaction chamber 31, hydroxide radicals ($OH^-$) are formed according to the relationship $O_2 + H_2 \rightarrow 2OH^-$.

An $OH^-$ radical can react with a ligand (R') of a ruthenium precursor. The ligand R' can be removed from the precursor and, as a result, the π-bond between the cyclopentadienyl ligand(s) and the noble metal can become unstable resulting in a spontaneous separation of the cyclopentadienyl ligand(s) from the noble metal. Thus, in contrast to a conventional method in which an oxidizing gas reacts with a metal source gas, according to a preferred method, a gas in a radical state reacts with the Cp precursor causing the π-bond between the Cp ligand and the noble metal to break and form a noble metal. As a result of the reaction, only the noble metal remains on the bottom structure 10. As disclosed above, when the atomic ratio of the reducing gas to the oxidizing gas is greater than about 90%, a noble metal layer can be formed. When a noble metal oxide layer is to be formed, the atomic ratio of the reducing gas to the oxidizing gas is preferably less than about 10%. The oxidizing gas present in the reaction chamber after the formation of the noble metal can react with the noble metal layer to form the noble metal oxide.

After the completion of the reaction on the bottom structure 10, the source gas and/or reaction gases remaining in the reaction chamber 31 can be exhausted or the reaction chamber 31 can be purged with an inert gas (a purge gas).

Figure 3D:
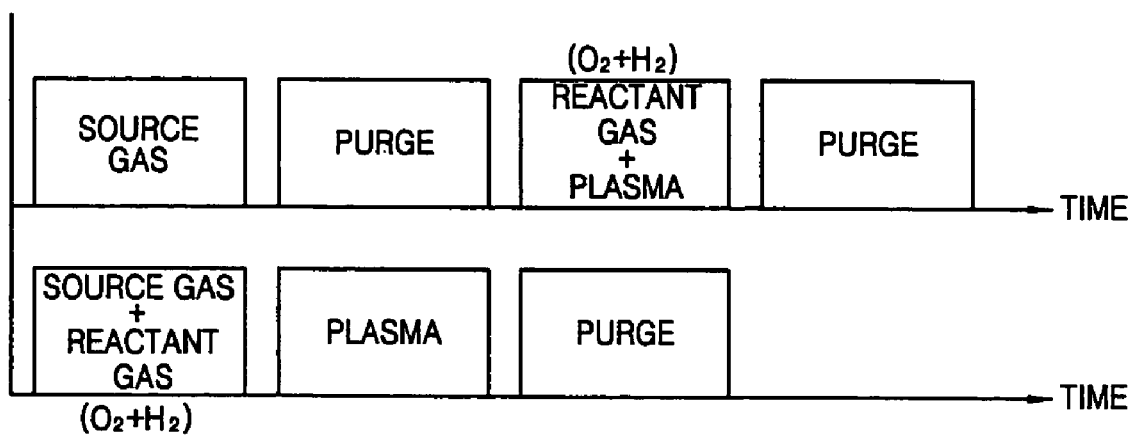
FIG. 3D is a timing view illustrating a process sequence for forming a mono-layer of noble metal using an oxidation-reduction reaction.

FIG. 3D is a flow chart illustrating preferred processing sequences for forming mono-layers of a noble metal using an oxidation-reduction reaction. The process according to one embodiment includes flowing a noble metal source gas into a reaction chamber having a bottom structure placed therein, purging the chamber, flow an oxidizing gas and a reducing gas into the reaction chamber, generating plasma within the chamber to form a noble metal (or noble metal oxide) layer on the bottom structure, and purging the reaction chamber. The process according to a further embodiment includes flowing a noble metal source gas, an oxidizing gas, and a reducing gas simultaneously into a reaction chamber having a bottom structure placed therein, generating plasma within the chamber to form a noble metal (or noble metal oxide) layer on the bottom structure, and purging the reaction chamber.

Figure 4:
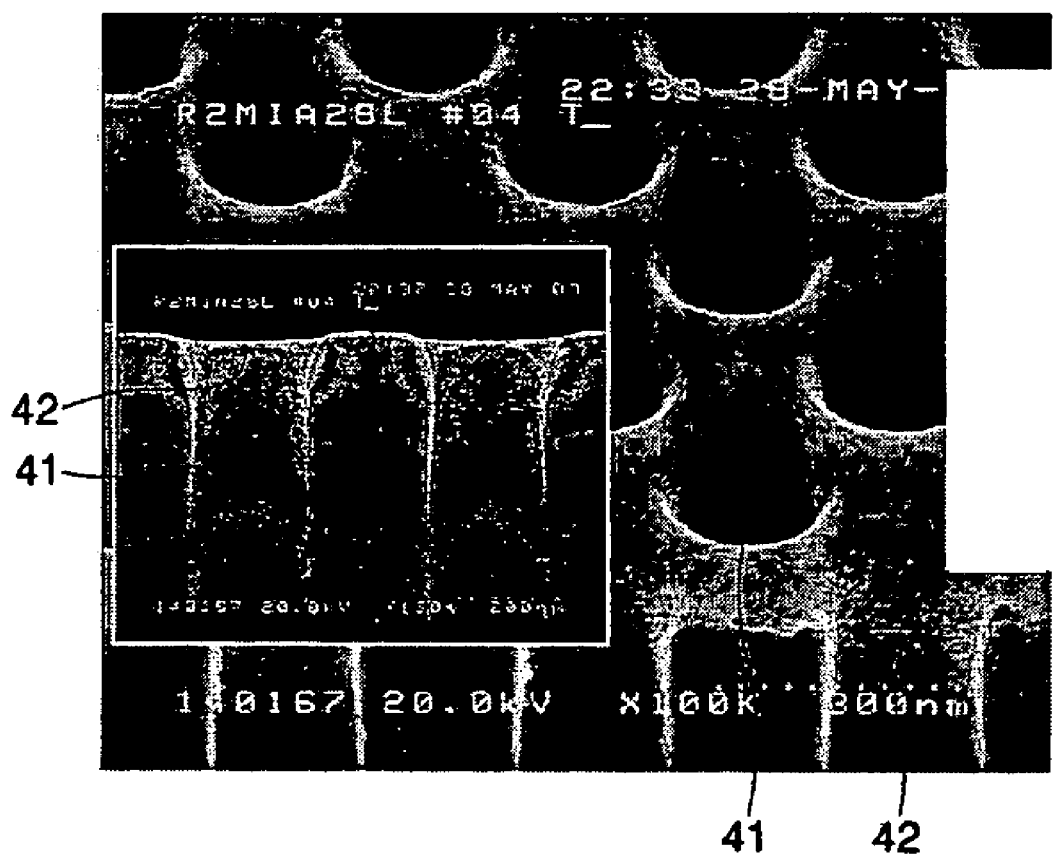
FIG. 4 is an SEM micrograph showing a noble metal coating formed by an oxidation-reduction reaction over an $SiO_2$ via.

FIG. 4 is an SEM micrograph of an $SiO_2$ bottom structure comprising a coating of ruthenium. The ruthenium coating was formed by an oxidation-reduction reaction. In this case, Ru(i-Pr)Cp(ethanol), a Cp precursor in which the Cp is π-bonded to Ru, was used as a source gas and flowed into a reaction chamber for 0.008-10 seconds. An oxidizing gas ($O_2$) and a reducing gas ($H_2$) were flowed into the reaction chamber for 1-10 seconds. In order to obtain a pure Ru layer, the $O_2$ was flowed into the reaction chamber at a gas flow rate of about 30 sccm and the $H_2$ was flowed into the reaction chamber at a gas flow rate of about 300 sccm.

Still referring to FIG. 4, a plurality of holes 41 are formed in a surface of an $SiO_2$ bottom structure, as in a three-dimensional capacitor structure having a bottom electrode formed thereon. Under the operation conditions described above, a ruthenium layer was formed in the holes 41 and on the surface 42 of the $SiO_2$ bottom structure.

A noble metal layer, which may used as an electrode in a semiconductor device such as a capacitor, can be formed by simultaneously flowing an oxidizing gas and a reducing gas into an ALD reaction chamber and reacting these gases in the presence of a noble metal precursor. By controlling the ratio of the oxidizing gas to the reducing gas, a noble metal layer or a noble metal oxide layer can be formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of depositing a noble metal electrode using an oxidation-reduction reaction, comprising:
   flowing a noble metal source gas, an oxidizing gas, and a reducing gas into a reaction chamber wherein the ratio of the reducing gas to the oxidizing gas is greater than about 90 atomic percent based on the total of the reducing gas and the oxidizing gas; and
   generating plasma in the reaction chamber to form a noble metal layer on a bottom structure.

2. The method of claim 1, wherein the noble metal source gas, the oxidizing gas, and the reducing gas are simultaneously flowed into the reaction chamber.

3. The method of claim 1, wherein the oxidizing gas and the reducing gas are simultaneously flowed into the reaction chamber.

4. The method of claim 1, wherein the noble metal source gas comprises a cyclopentadienyl precursor.

5. The method of claim 1, wherein the noble metal source gas includes at least one of $Ru(iPr-Cp)_2$ and $Ru(i-Pr)Cp(ethanol)$.

6. The method of claim 1, wherein the oxidizing gas includes at least one of $O_2$ and $NO_2$ and the reducing gas includes at least one of $NH_3$, $H_2O$ and $H_2$.

7. The method of claim 1, wherein an operation temperature in the reaction chamber is about 150-350° C.

8. The method of claim 1, wherein a coating of the noble metal precursor is formed on the bottom structure prior to generating the plasma.

9. The method of claim 1, wherein the step of flowing comprises flowing a noble metal source gas into the reaction chamber, purging the reaction chamber and flowing an oxidizing gas and a reducing gas into a reaction chamber.

10. The method of claim 1, further comprising purging the reaction chamber after forming the noble metal layer.

11. The method of claim 1, wherein the noble metal electrode is a monolayer.

12. A method of manufacturing a semiconductor capacitor comprising a bottom structure and a bottom electrode, a dielectric layer, and a top electrode sequentially formed on the bottom structure,
   wherein the bottom electrode and/or the top electrode are formed using a method of depositing a noble metal electrode using an oxidation-reduction reaction, comprising:
   flowing a noble metal source gas, an oxidizing gas, and a reducing gas into a reaction chamber wherein the ratio of the reducing gas to the oxidizing gas is greater than about 90 atomic percent based on the total of the reducing gas and the oxidizing gas; and
   generating plasma in the reaction chamber to form a noble metal layer.

13. The method of claim 12, wherein the noble metal source gas, the oxidizing gas, and the reducing gas are simultaneously flowed into the reaction chamber.

14. The method of claim 12, wherein the oxidizing gas and the reducing gas are simultaneously flowed into the reaction chamber.

15. The method of claim 12, wherein the noble metal source gas comprises a cyclopentadienyl precursor.

16. The method of claim 12, wherein the noble metal source gas includes at least one of $Ru(iPr-Cp)_2$ and $Ru(i-Pr)Cp(ethanol)$.

17. The method of claim 12, wherein the oxidizing gas includes at least one of $O_2$ and $NO_2$ and the reducing gas includes at least one of $NH_3$, $H_2O$ and $H_2$.

18. The method of claim 12, wherein an operation temperature in the reaction chamber is about 150-350° C.

19. The method of claim 12, wherein a coating of the noble metal source gas is formed on the bottom structure prior to generating the plasma.

20. The method of claim 12, wherein the step of flowing comprises flowing a source gas into the reaction chamber, purging the reaction chamber and flowing an oxidizing gas and a reducing gas into a reaction chamber.

21. The method of claim 12, further comprising purging the reaction chamber after forming the noble metal layer.

22. The method of claim 12, wherein the noble metal electrode is a monolayer.

* * * * *